(12) United States Patent
Wallace

(10) Patent No.: US 7,053,483 B2
(45) Date of Patent: May 30, 2006

(54) SEMICONDUCTOR PACKAGE USING TERMINALS FORMED ON A CONDUCTIVE LAYER OF A CIRCUIT BOARD

(75) Inventor: Robert F. Wallace, Sunnyvale, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 11/021,169

(22) Filed: Dec. 21, 2004

(65) Prior Publication Data

US 2005/0099784 A1    May 12, 2005

Related U.S. Application Data

(60) Continuation of application No. 09/866,022, filed on May 24, 2001, now Pat. No. 6,867,485, which is a continuation of application No. 09/487,106, filed on Jan. 19, 2000, now Pat. No. 6,410,355, which is a division of application No. 09/096,140, filed on Jun. 11, 1998, now Pat. No. 6,040,622.

(51) Int. Cl.
*H01L 23/34* (2006.01)

(52) U.S. Cl. ........................ 257/723; 257/687
(58) Field of Classification Search ............ 257/679, 257/687, 723
See application file for complete search history.

(56) References Cited

U.S. PATENT DOCUMENTS

| | | | |
|---|---|---|---|
| 4,054,938 A | 10/1977 | Morris, Sr. | |
| 4,222,516 A | 9/1980 | Badet et al. | |
| 4,264,917 A | 4/1981 | Ugon | |
| 4,463,971 A | 8/1984 | Hoppe et al. | |
| 4,532,419 A * | 7/1985 | Takeda | 235/492 |
| 4,649,418 A | 3/1987 | Uden | |
| 4,754,319 A | 6/1988 | Saito et al. | |
| 4,766,480 A | 8/1988 | Hamada | |
| 4,872,825 A | 10/1989 | Ross | |
| 4,931,853 A | 6/1990 | Ohuchi et al. | |
| 4,961,053 A | 10/1990 | Krug | |
| 4,990,759 A | 2/1991 | Gloton et al. | |
| 4,994,659 A | 2/1991 | Yabe et al. | |
| 5,036,430 A | 7/1991 | Hills | |
| 5,144,747 A | 9/1992 | Eichelberger | |
| 5,272,374 A | 12/1993 | Kodai et al. | |

(Continued)

FOREIGN PATENT DOCUMENTS

DE    535436 A2    9/1992

(Continued)

OTHER PUBLICATIONS

"Smart Card Standards", smart Card Industry Association, www.scia.org/aboutSmartcards, ISO 7816 Parts 1-3, pp. 1-23 (Jan. 10, 2000).

*Primary Examiner*—Roy Potter
(74) *Attorney, Agent, or Firm*—Parsons Hsue & De Runtz LLP

(57) ABSTRACT

A small package is provided for a flash EEPROM memory. The small package uses terminals which are part of a bottom conductive layer of a circuit board. In this manner, the final package can be quite thin. The circuit board can be connected to the integrated circuits and passive devices and can be encapsulated in plastic or glued to a plastic cover. In this manner, a thin and relatively inexpensive package can be formed. Additionally, the circuit board can have testing connections which can be removed before forming the final package.

17 Claims, 4 Drawing Sheets

U.S. PATENT DOCUMENTS

| | | |
|---|---|---|
| 5,307,240 A | 4/1994 | McMahon |
| 5,315,241 A | 5/1994 | Ewers |
| 5,375,037 A | 12/1994 | Le Roux |
| 5,493,151 A | 2/1996 | Asada et al. |
| D368,082 S | 3/1996 | Goto |
| 5,550,709 A | 8/1996 | Iwasaki |
| 5,581,065 A | 12/1996 | Nishikawa et al. |
| 5,612,532 A | 3/1997 | Iwasaki |
| 5,663,901 A | 9/1997 | Wallace et al. |
| 5,677,524 A | 10/1997 | Haghiri-Tehrani |
| 5,752,857 A | 5/1998 | Knights |
| 5,757,116 A | 5/1998 | Nishikawa et al. |
| 5,770,877 A | 6/1998 | Park |
| 5,783,857 A | 7/1998 | Ziegner et al. |
| 5,796,164 A | 8/1998 | McGraw et al. |
| 5,822,190 A | 10/1998 | Iwasaki |
| 5,874,319 A | 2/1999 | Dunaway et al. |
| 5,906,516 A | 5/1999 | Sato et al. |
| 5,933,713 A | 8/1999 | Farnworth |
| 6,002,178 A | 12/1999 | Lin |
| 6,104,095 A | 8/2000 | Shin et al. |
| 6,109,939 A | 8/2000 | Kondo et al. |
| 6,137,710 A | 10/2000 | Iwasaki et al. |
| 6,180,881 B1 | 1/2001 | Isaak |
| 6,199,756 B1 | 3/2001 | Kondo et al. |

FOREIGN PATENT DOCUMENTS

| | | |
|---|---|---|
| JP | 61-15289 A | 6/1984 |

* cited by examiner

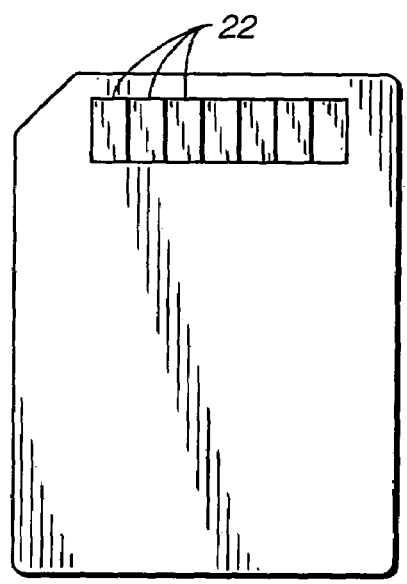
FIG._1
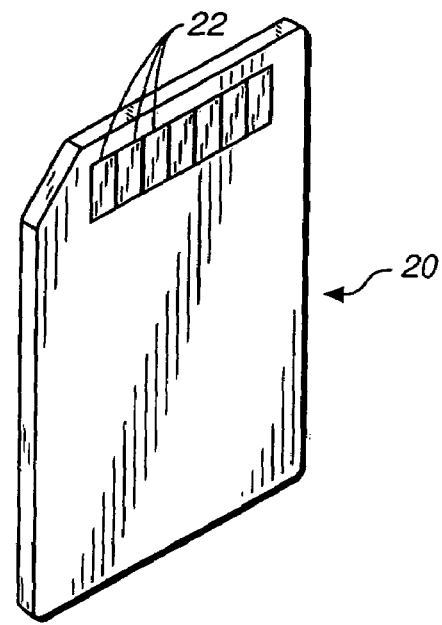
FIG._2
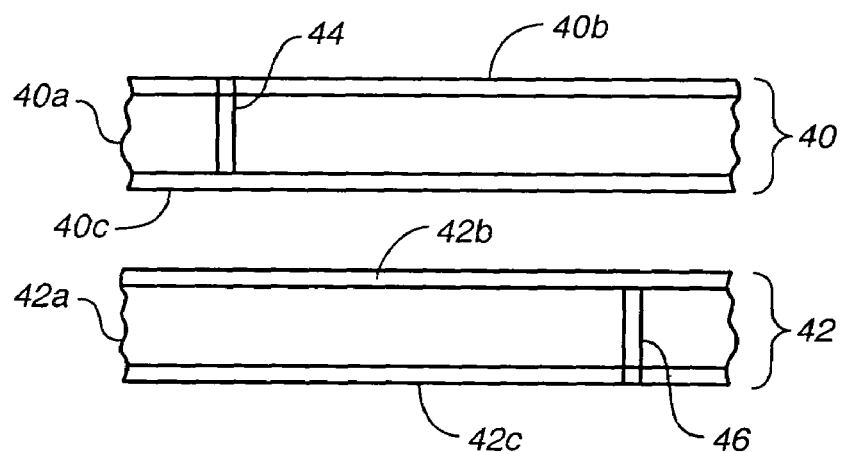
FIG._6
(PRIOR ART)

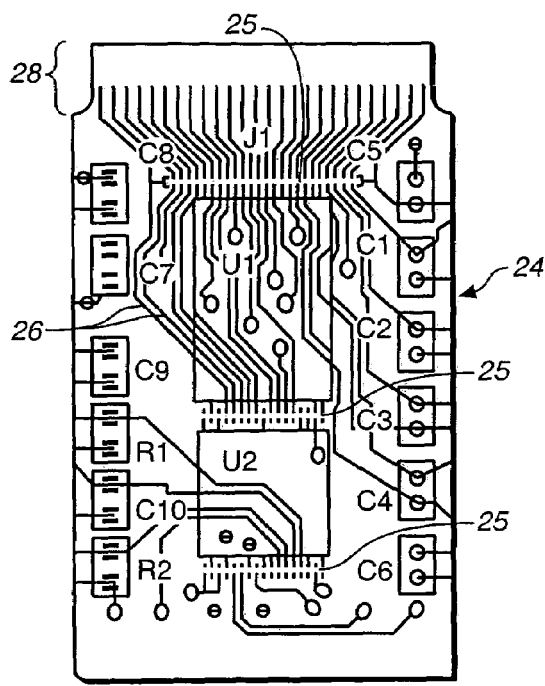
FIG._3A
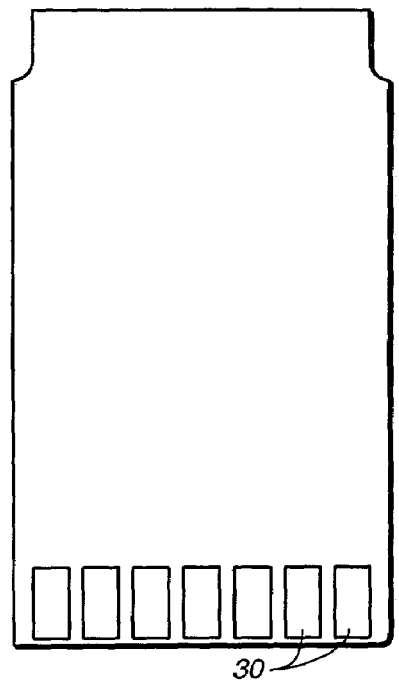
FIG._3B
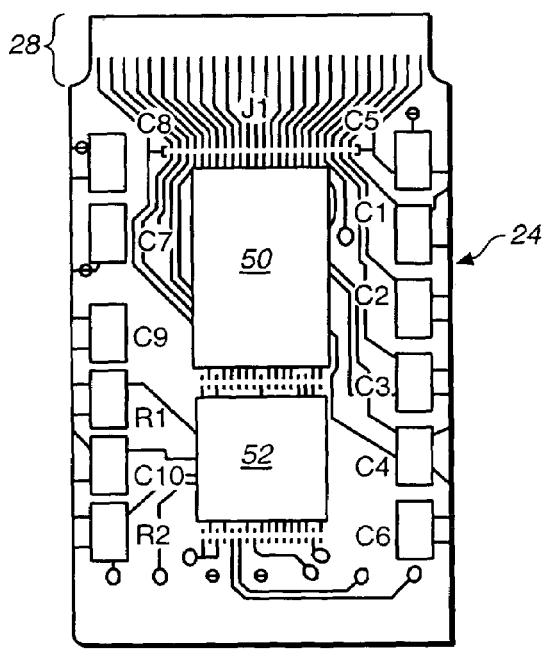
FIG._4
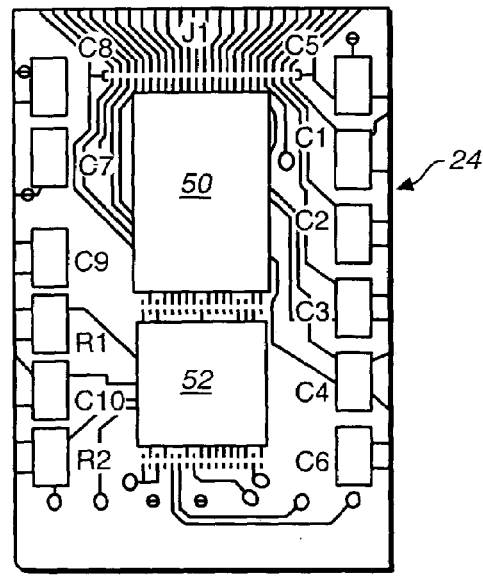
FIG._5

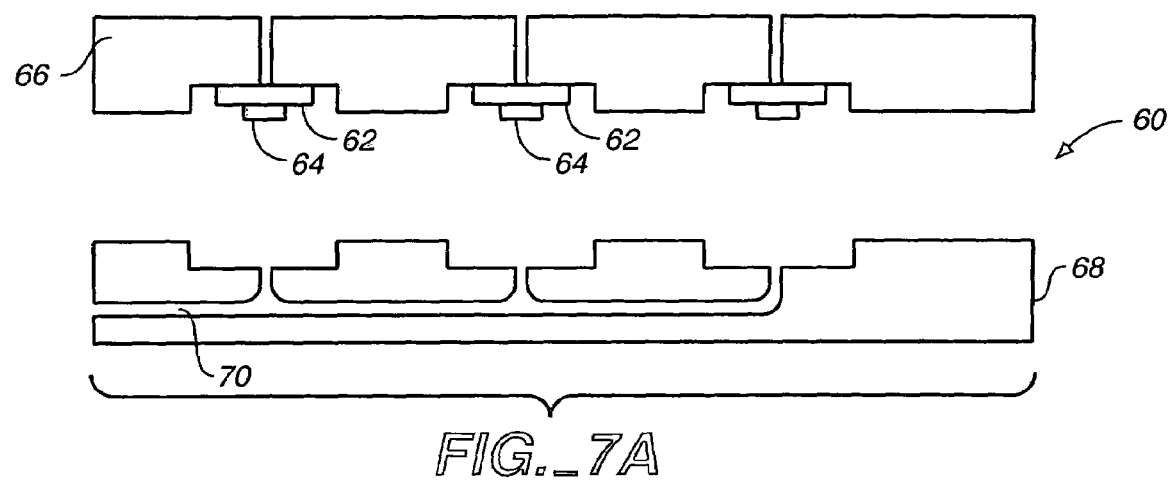
FIG._7A
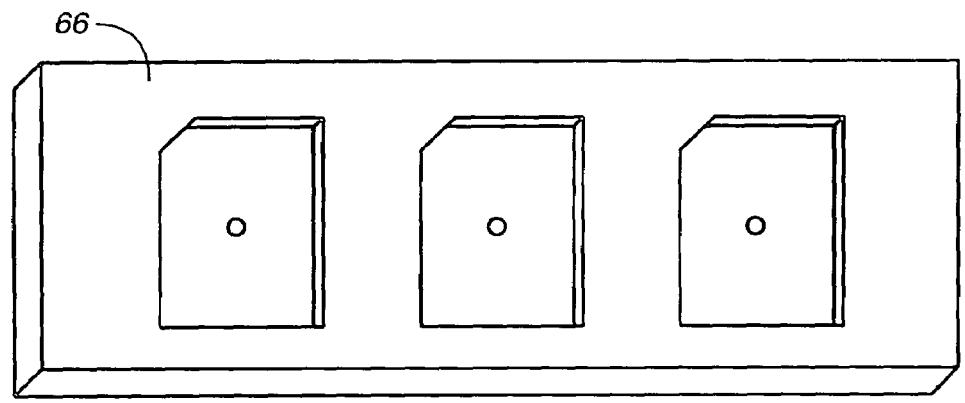
FIG._7B
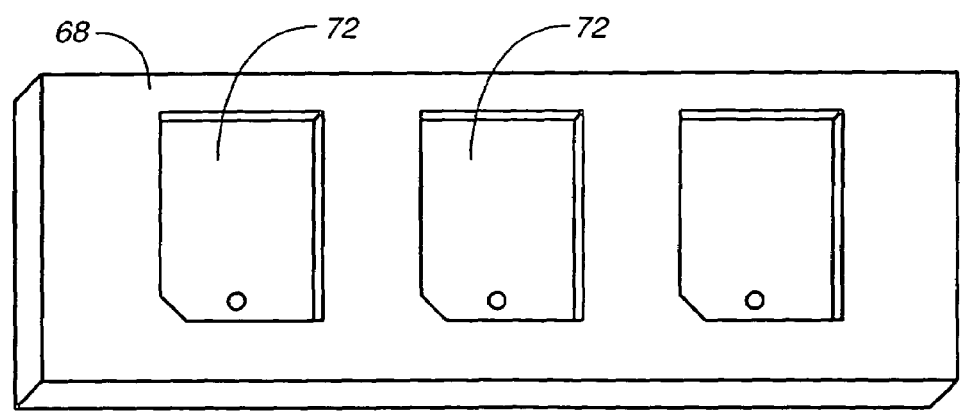
FIG._7C

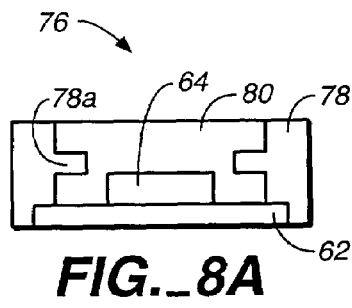
FIG._8A
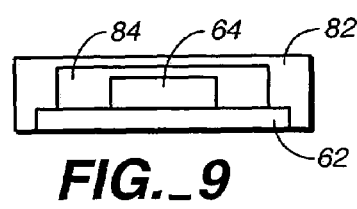
FIG._9
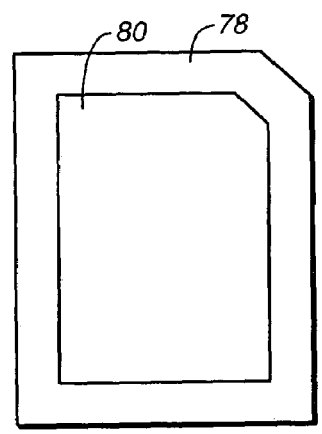
FIG._8B
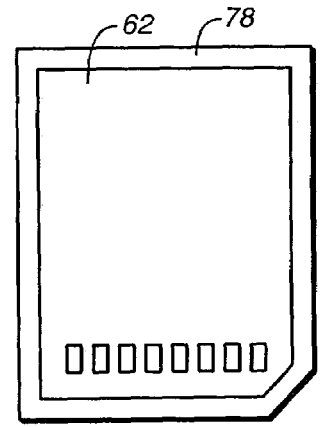
FIG._8C
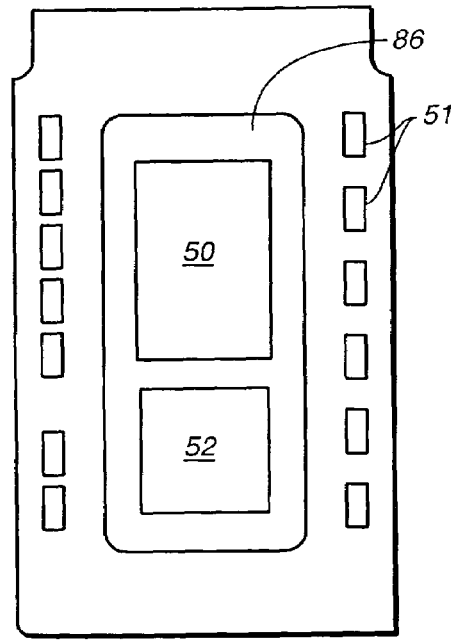
FIG._10
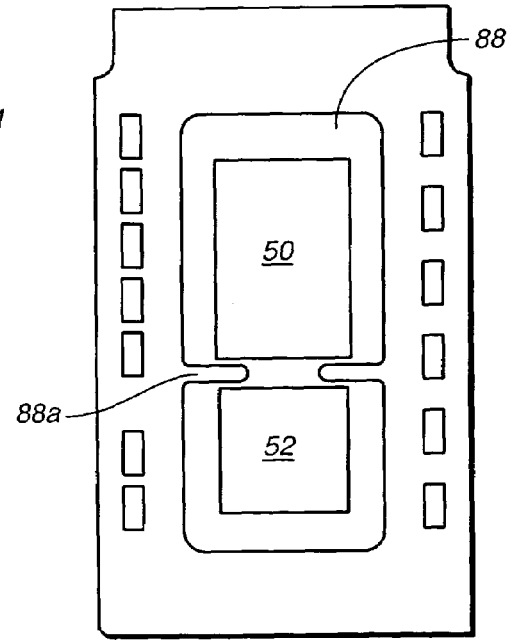
FIG._11

US 7,053,483 B2

SEMICONDUCTOR PACKAGE USING TERMINALS FORMED ON A CONDUCTIVE LAYER OF A CIRCUIT BOARD

CROSS-REFERENCE TO RELATED APPLICATIONS

This application is a continuation of U.S. patent application Ser. No. 09/866,022, filed May 24, 2001, now U.S. Pat. No. 6,867,485, which is a continuation of U.S. patent application Ser. No. 09/487,106, filed Jan. 19, 2000, now U.S. Pat. No. 6,410,355, which is a divisional of U.S. patent application Ser. No. 09/096,140, filed Jun. 11, 1998, now U.S. Pat. No. 6,040,622, issued Mar. 21, 2000 which applications are incorporated herein in their entirety by this reference.

FIELD OF THE INVENTION

The present invention relates to the packaging of semiconductor integrated circuits. In particular, the system relates to the packaging of memory chips.

BACKGROUND OF THE INVENTION

In recent years, flash Electrically Erasable Programmable Read-Only Memory (EEPROM) has become popular. Flash EEPROMs are a high-density, nonvolatile memory.

This flash EEPROM package contains multiple integrated circuits, including a controller chip and a memory chip. The flash memory packages also require capacitors for charge pumping so that the required programming voltage can be obtained from a lower circuit voltage.

It is desired to have a smaller, thinner memory package format to be used with digital cameras and the like.

SUMMARY OF THE PRESENT INVENTION

In order to have a small package, the system of the present invention puts the integrated circuits onto a circuit board or PC board, where a conductive layer of the circuit board forms the terminals for the package. This conductive layer of the circuit board is positioned on the outside of the package. In this way, a very thin package can be produced. No additional connections are required from the circuit board to terminals.

In one preferred embodiment, the circuit board with the integrated circuits and passive devices can be placed in a mold and encapsulated in plastic with the terminal side of the circuit board exposed. Before the encapsulating process, the integrated circuits used in the package can be covered with an epoxy material or with another type of plastic for protection. Alternately, the circuit board with the integrated circuits and passive devices can be glued into a plastic case or overmolded.

Another embodiment of the present invention concerns a testing connection region of the circuit board. At one end of the circuit board, testing connections allow access to the integrated circuits for burn-in testing the integrated circuits and allow the programming of the integrated circuits so as to avoid bad memory cells. The testing connection region of the circuit board material is cut away before packaging so that the final package can have a smaller form.

BRIEF DESCRIPTION OF THE DRAWINGS

FIG. 1 is an actual-size bottom view of the package of the present invention.

FIG. 2 is an enlarged perspective view of the package of the present invention.

FIGS. 3A and 3B are enlarged front and back views of the circuit board material for use in the package of the present invention.

FIG. 4 is a top view of the circuit board with integrated circuits and passive devices.

FIG. 5 illustrates the circuit board with integrated circuits and passive devices with the testing connection region removed.

FIG. 6 is a exploded cross-sectional diagram of a prior art circuit board material.

FIG. 7A is a cross-sectional view of a mold for use with the package of the present invention.

FIG. 7B is a perspective view showing the top portion of the mold of FIG. 7A.

FIG. 7C is a perspective view showing the bottom portion of the mold of FIG. 7A.

FIG. 8A is a cross-sectional view of a package of the present invention having a frame.

FIG. 8B is a top view of a package of FIG. 8A.

FIG. 8C is a bottom view of a package of FIG. 8A.

FIG. 9 is a cross-sectional view of an alternate embodiment of the present invention in which the circuit board is glued into a plastic cover.

FIG. 10 is a top view of the circuit board with protective material around the integrated circuits.

FIG. 11 is a top view of an alternate embodiment showing the circuit board with protective material around the integrated circuits.

DETAILED DESCRIPTION OF THE PREFERRED EMBODIMENT

FIG. 1 is a bottom view of a package 20 of the present invention. The package 20 is shown with terminals 22 which, as described below, are part of a circuit board. FIG. 1 shows the actual size of a preferred embodiment. The package in the preferred embodiment is 1¼ inches long by ⅞ of an inch wide. In the preferred embodiment, the thickness of the package is preferably 12 mils or less. Such a small-sized package can be advantageously used with systems such as digital cameras in which size is a factor. FIG. 2 is a perspective view of the package which is shown enlarged.

FIG. 3A is an enlarged top view of a circuit board 24 for use with the package of the present invention. The circuit board 24 includes a number of conductive traces 26 which interconnect the integrated circuits and passive devices once they are placed on the circuit board 24. Connecting regions 25 are provided so that leads from the integrated circuits can be connected to the circuit board by conventional wire bonding.

Testing connections 28 are also provided interconnected to the integrated circuits. As is described below, the testing connections 28 can be used for burn-in testing and memory mapping the devices. The testing connections 28 are removed after testing to make the final package size smaller.

FIG. 3B shows the back side of the circuit board. Note that in the preferred embodiment, the back side of the circuit board material only contains the terminals 30. This allows the circuit board to be exposed on the outside of the package. The visual effect of the package is improved and the problem of inadvertent electrical connections to the package is reduced. The terminals 30 are connected by vias to the integrated circuits. The terminals 30 allow for the reading and writing of data from the flash EEPROM package. Note that the terminals are not at the edge of the package but on one of the sides.

FIG. 6 illustrates the construction of a prior art circuit board. As shown in FIG. 6, in a preferred embodiment, the circuit board is a PC board comprising two sections, 40 and 42. Section 40 comprises an insulating layer 40*a* with conductive layers 40*b* and 40*c*, formed thereupon. These layers are patterned so as to interconnect the different devices on the PC board. Connections between layers such as layers 40*b* and 40*c* can be made by conductive vias, such as the vias 44 or 46. Similarly, the section 42 comprises an insulating layer 42*a* and conductive layers 42*b* and 42*c*. In the preferred embodiment, layer 42*c* is patterned to form the terminals with no other conductive traces on that layer. Sections 40 and 42 can be connected by a thin glue layer. The PC board materials can be quite thin; in one preferred embodiment, the PC board material is 3 mils thick or less.

FIG. 4 shows integrated circuits 50 and 52, placed on the circuit board 24. The integrated circuits 50 and 52 are glued onto the circuit board and, as described above, wire bond connections are made from the die bond pads to the regions 25. In a preferred embodiment, integrated circuit 52 is a controller chip and integrated circuit 50 is a main memory chip. Passive devices are also connected to the circuit board. For example, charge-pumping capacitors are used to convert the supplied voltage to the larger voltage required to modify the flash EEPROM. In one preferred embodiment, the capacitors can convert a 2.6 volt supplied voltage info the required 11 volts. As described above, once the integrated circuits and passive devices are connected, the testing connection region 28 can be used for the testing and memory mapping of the EEPROM circuitry. Note that the testing connection region 28 can have a greater number of contacts than the package terminals. In the embodiment shown, there are seven terminals in the final package and twenty-six contacts used for the testing connection region. In a preferred embodiment, the burn-in testing involves the operation of the unit at relatively high voltages. After burn-in testing, defective memory cells are mapped-out. As shown in FIG. 5, the test connection region 28 is cut-off after the burn-in testing and memory mapping have been done. This allows for a smaller final package.

FIGS. 7A–7C illustrate the injection molding of the circuit board with associated integrated circuits and passive devices into a package. The circuit board 62 with the attached integrated circuit 64 is vacuum clamped to the top portion 66 of the injection mold 60. The bottom portion 68 of the injection mold is attached to the top portion 66 and plastic materials under heat and pressure are injected into the mold to surround the top and sides of the circuit board 62 and integrated circuit 64. In a preferred embodiment, the plastic material is a thermal plastic or a thermal setting plastic. The plastic is injected through the ports 70. The clamping of the bottom of the circuit board 62 to the top portion 66 prevents the terminals of the package from being coated with the injected plastic material. FIG. 7B shows the top portion 66 of the clamp. FIG. 7C shows the bottom portion 68 of the clamp. Note that the bottom portion 68 allows for a region 72 in which a label can be positioned so that the final package includes a label.

The use of a circuit board with the injection molding process has a number of advantages. The circuit board material allows for the interconnection of more than one integrated circuit on the multiple connective layers. It also allows for the dedication of one conductive layer for terminals.

FIG. 8A is a cross-sectional view of a modified injection molded embodiment. This modified injection molded embodiment produces a package 76 having a plastic frame 78. The circuit board 62 and integrated circuit 64 are positioned on the frame 78 and an injection molded plastic material 80 added. In a preferred embodiment, the frame 78 includes a projection 78*a* which helps the injection plastic material 80 attach to the frame 78. FIG. 8B shows a top view of the package of the embodiment of FIG. 8A. FIG. 8C shows the bottom view of the package of the embodiment of FIG. 8A.

In an alternate embodiment, a plastic cover 82 can be glued to the circuit board material 62 and integrated circuit 64 using an epoxy 84. The injection molding methods have some advantages over this alternate embodiment since they do not require processing by hand. Additionally, the plastic molded package will be more durable and corrosion resistant than the glued package. However, both methods allow for an inexpensive package.

Looking again at FIG. 7A, in a preferred embodiment, the integrated circuits 64 will be isolated by a protective material from the relatively hot plastic injection molding material. In one embodiment, the integrated circuits are protected by an epoxy coating.

FIGS. 10 and 11 show an alternate embodiment in which the integrated circuits 50 and 52 are protected by a first plastic encapsulating step. The first plastic encapsulating step can preferably be a transfer done at lower temperatures than the injection molding. This will protect the integrated circuits 50 and 52 from temperature and stress. The transfer molded plastic 86 need not cover the passive devices 51 which are allowed to contact the higher temperature plastic. Note that in the embodiment of FIG. 11, there is a narrow region 88*a* of the transfer molded plastic 88 surrounding the integrated circuits. This narrow region 88*a* is used to reduce the stress between the integrated circuits.

Various details of the implementation and method are merely illustrative of the invention. It will be understood that various changes in such details may be within the scope of the invention, which is to be eliminated only by the appending claims.

What is claimed is:

1. A flash EEPROM package including:
   a circuit board;
   at least one integrated circuit on the circuit board; and
   packaging material surrounding the at least one integrated circuit and part of the circuit board, wherein one side of the circuit board is exposed, the exposed side of the circuit board including a set of terminals connected to the remainder of the circuit board by vias.

2. The package of claim 1, wherein the circuit board material is attached to the packaging material by epoxy.

3. The package of claim 1, wherein on the exposed side of the circuit board only the set of terminals is exposed.

4. The package of claim 1, wherein the circuit elements includes at least two integrated circuits and passive devices.

5. The package of claim 1, wherein the thickness of the package is less than 12 mils.

6. A flash EEPROM package, comprising:
   a circuit board;
   one or more integrated circuits on a first side of the circuit board, the one or more integrated circuits including at least one flash EEPROM memory array;
   terminals on an opposing second side of the circuit board;

packaging material overlying the first side of the circuit board and overlying the one or more integrated circuits, the packaging material conforming to surfaces of the first side of the circuit board and the one or more integrated circuits.

7. The flash EEPROM package of claim 6 wherein the packaging material is formed by injection molding.

8. The flash EEPROM package of claim 6 wherein the packaging material does not overlie any of the second side of the circuit board.

9. The flash EEPROM package of claim 6 wherein a packaging frame extends from the circuit board and encloses the packaging material.

10. The flash EEPROM package of claim 9 wherein the packaging frame includes one or more projections that interlock with the packaging material.

11. The flash EEPROM package of claim 6 further comprising a transfer molded plastic portion encapsulating the one or more integrated circuits, the transfer molded plastic portion covered by packaging material.

12. The flash EEPROM package of claim 11 wherein the packaging material is formed subsequent to formation of the transfer molded plastic portion and the packaging material is formed at a higher temperature than the transfer molded plastic portion.

13. The flash EEPROM package of claim 6 wherein the second side of the circuit board is bounded by a perimeter and the terminals are separated from the perimeter by a distance.

14. A flash EEPROM package comprising:
  a circuit board having a first side and an opposing second side;
  at least one EEPROM integrated circuit on the first side of the circuit board;
  at least one passive device on the first side of the circuit board;
  packaging material surrounding the at least one integrated circuit and covering at least a portion of the first side of the circuit board; and
  a plurality of terminals on the second side of the circuit board.

15. The flash EEPROM package of claim 14 wherein the second side of the circuit board is uncovered by packaging material.

16. The flash EEPROM package of claim 14 wherein the at least one passive device includes charge pump capacitors.

17. The flash EEPROM package of claim 16 wherein the charge pump capacitors are used to convert a supplied voltage to a voltage that is higher than the supplied voltage.

* * * * *